(12) United States Patent
Sakhaii

(10) Patent No.: US 7,746,071 B2
(45) Date of Patent: Jun. 29, 2010

(54) METHOD FOR THE ACQUISITION OF DATA RELATING TO MULTI-DIMENSIONAL NMR SPECTRA BY MEANS OF FREQUENCY-DEPENDENT CONVOLUTION

(75) Inventor: Peyman Sakhaii, Frankfurt a.M. (DE)

(73) Assignee: Bruker BioSpin GmbH, Rheinstetten (DE)

( * ) Notice: Subject to any disclaimer, the term of this patent is extended or adjusted under 35 U.S.C. 154(b) by 184 days.

(21) Appl. No.: 11/887,737

(22) PCT Filed: Mar. 31, 2006

(86) PCT No.: PCT/EP2006/002923

§ 371 (c)(1),
(2), (4) Date: Oct. 3, 2007

(87) PCT Pub. No.: WO2006/105909

PCT Pub. Date: Oct. 12, 2006

(65) Prior Publication Data

US 2009/0051360 A1    Feb. 26, 2009

(30) Foreign Application Priority Data

Apr. 8, 2005    (EP) ................................. 05007767

(51) Int. Cl.
G01V 3/00    (2006.01)

(52) U.S. Cl. ..................................................... 324/309

(58) Field of Classification Search ......... 324/300–322; 600/407–435
See application file for complete search history.

(56) References Cited

U.S. PATENT DOCUMENTS

| | | | | |
|---|---|---|---|---|
| 6,037,772 A | * | 3/2000 | Karczmar et al. ........... | 324/309 |
| 6,504,368 B2 | * | 1/2003 | Ross et al. .................. | 324/307 |
| 6,806,706 B2 | * | 10/2004 | Gurr ........................... | 324/307 |
| 7,081,753 B2 | * | 7/2006 | Mullen et al. ................ | 324/318 |
| 7,396,685 B2 | * | 7/2008 | Szyperski et al. ............ | 436/173 |
| 2009/0115414 A1 | * | 5/2009 | Szyperski et al. ........... | 324/309 |
| 2009/0136104 A1 | * | 5/2009 | Hajian et al. ................ | 382/128 |

FOREIGN PATENT DOCUMENTS

| | | |
|---|---|---|
| WO | WO 2004/007016 | 1/2004 |
| WO | WO 2004/011899 | 2/2004 |
| WO | WO 2004/011909 | 2/2004 |

OTHER PUBLICATIONS

Richard R. Erst, Geoffry Bodenhausen and Alexander Wokaun "Principles of Nuclear Magnetic Resonance in One and Two Dimensions". Clarendon Press, Oxford, (1999).

Frank J.M. van de Ven "Multidimensional NMR in liquids". VCH, New York 1995, pp. 21-23.

Frank J.M. van de Ven "Multidimensional NMR in liquids". VCH, New York 1995, pp. 163-165.

(Continued)

*Primary Examiner*—Brij B Shrivastav
(74) *Attorney, Agent, or Firm*—Paul Vincent

(57) ABSTRACT

In a method for the acquisition of data relating to multi-dimensional NMR spectra (designated as the SHARC protocol—SHaped, ARrayed aCquisition Protocol), crossed signals are shifted at will in frequency space using selective pulses and frequency dependent folding.

17 Claims, 12 Drawing Sheets

OTHER PUBLICATIONS

Ray Freeman "Shaped radiofrequency pulses in high resolution NMR". Journal of Progress in Nuclear Magnetic Resonance Spectroscopy 32 (1998) 59-106.

Stefan Berger "Richtlinien fuer die Wiedergabe von Pulssequenzen fuer die NMR-Spektroskopie in Loesung". Angew. Chem. 2003, 115, 3293-3301.

Reynolds 2002 American Chemical Society of Pharmacognosy, J.Nat. Prod., (2002).

William F. Reynolds and Raul G. Enriquez "Choosing the Best Pulse Sequences, Acquisition Parameters, Postacquisition Processing Strategies, and Probes for Natural Product Structure Elucidation by NMR Spectroscopy". J. Nat. Prod. 2002, 65, 221-244.

Kenji Takasugi "New Methods in Solution State NMR". http://www.enc-conference.org/Backup/DisplayAbstractList2.aspx?Conf=ENC2005&Session=P14, (2005).

Adrian J. Dunn and Philip J. Sidebottom "Fast $^1H$-$^{13}C$ correlation data for use in automatic structure confirmation of small organic compounds". Magn. Reson. Chem. 2005; 43:124-131.

Bernd Simon and Michael Sattler "Biomolekulare NMR-Spektroskopie auf der Ueberholspur". Angew. Chem. 2004, 116, 800-804.

Lewis E. Kay, Paul Keifer and Tim Saarinen "Pure Absorption Gradient Enhanced Heteronuclear Single Quantum Correlation Spectroscopy with Improved Sensitivity". J. Am. Chem. Soc. 1992, 114, 10663-10665.

Wiliam R. Croasmun and Rober M. K. Carlson "Two-Dimensional NMR Spectroscopy". VCH, New York, (2003).

Geoffrey Bodenhausen and David J. Ruben "Natural Abundance Nitrogen-15 NMR by Enhanced Heteronuclear Spectroscopy". Chemical Physics Letters, vol. 69, No. 1, Jan. 1, 1980, p. 185 ff.

* cited by examiner

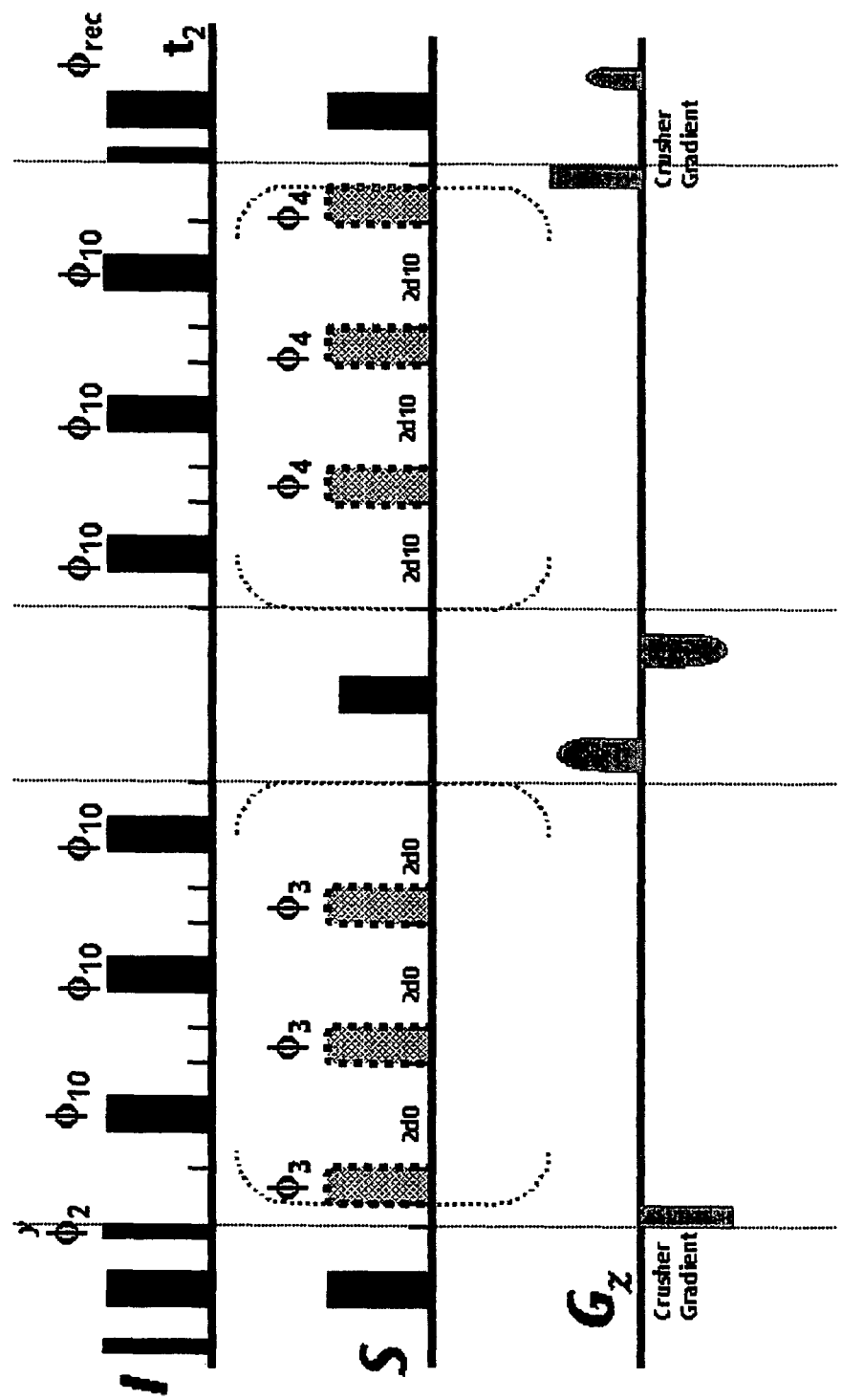
Fig. 6.1

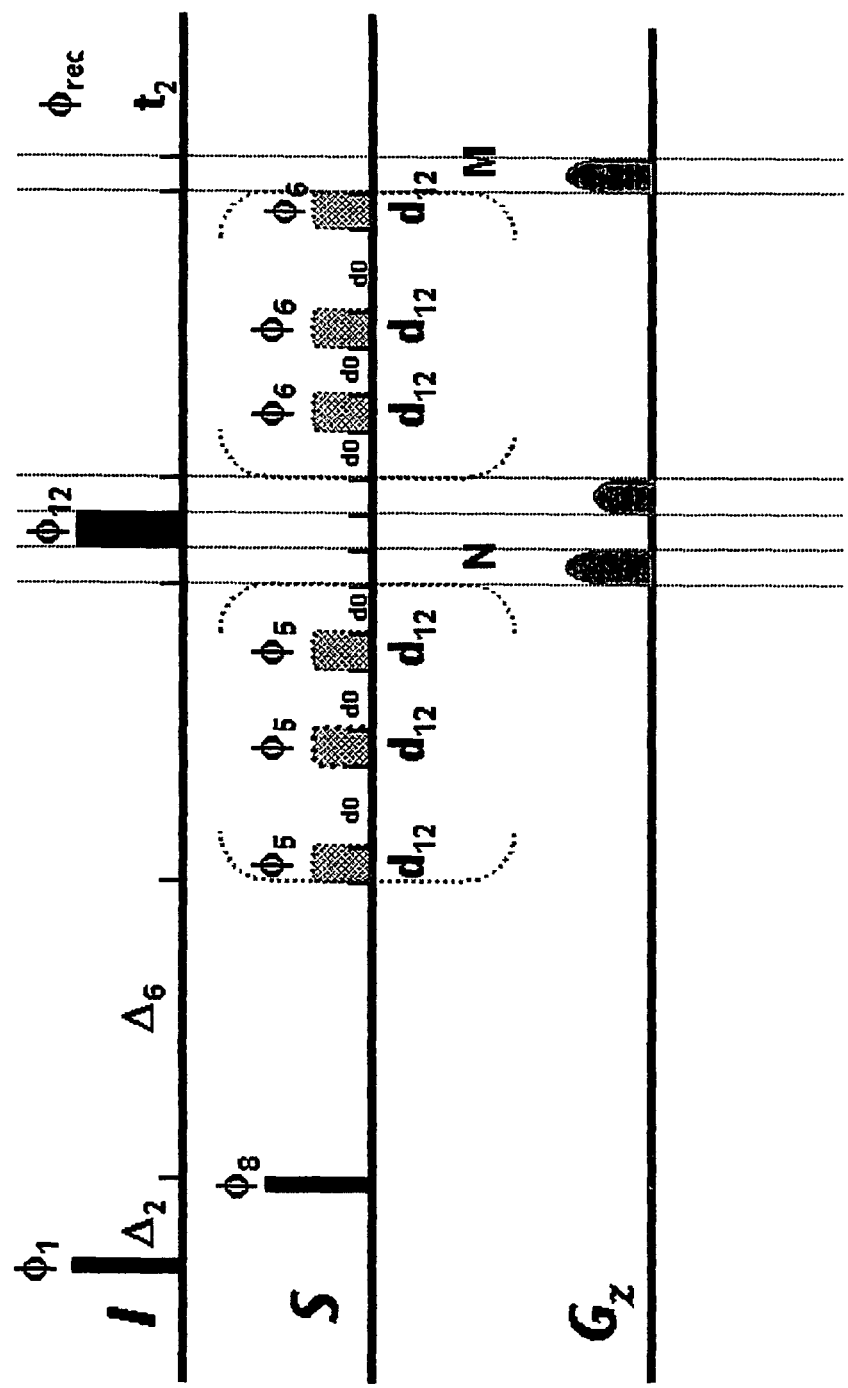
Fig. 7.1

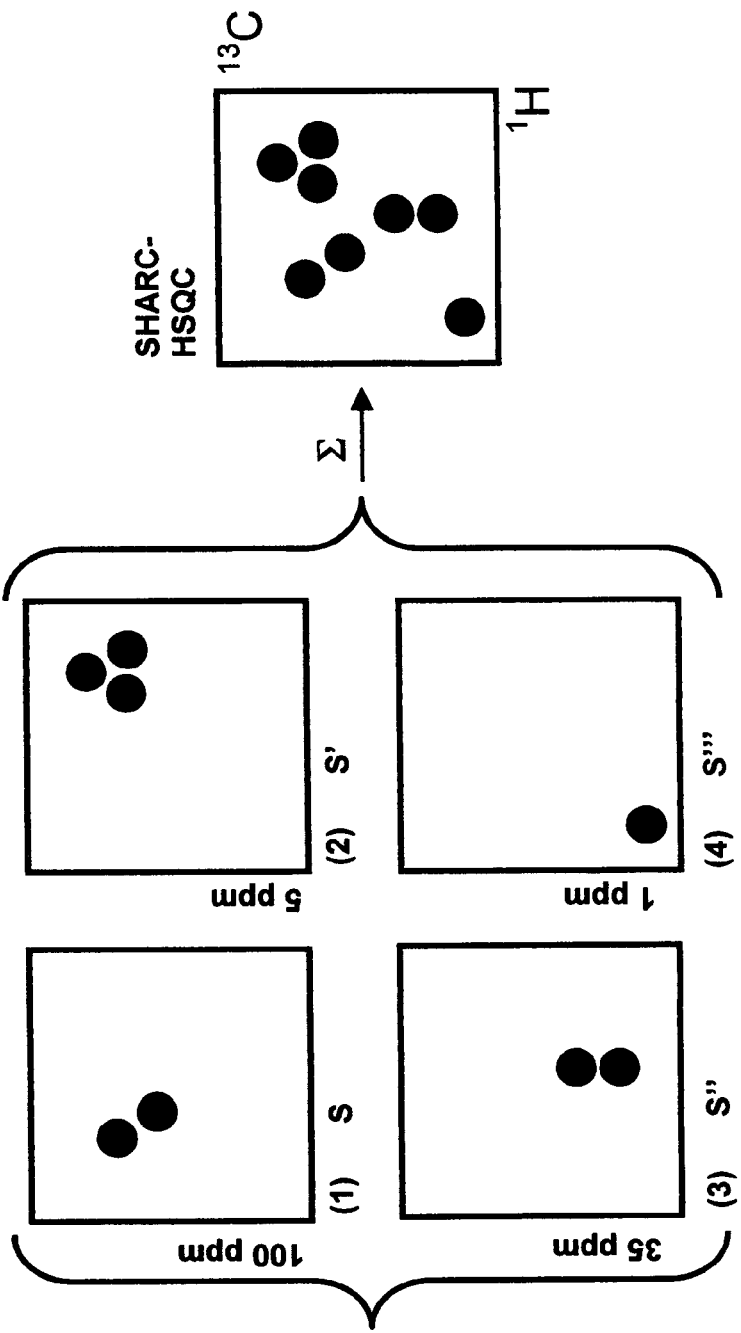
Fig. 10.1
Fig. 10.2

METHOD FOR THE ACQUISITION OF DATA RELATING TO MULTI-DIMENSIONAL NMR SPECTRA BY MEANS OF FREQUENCY-DEPENDENT CONVOLUTION

This application is the national stage of PCT/EP2006/002923 filed on Mar. 31, 2006 and also claims Paris Convention priority to EP 05 007 767.6 filed Apr. 8, 2005.

BACKGROUND OF THE INVENTION

Multi-dimensional NMR spectra are generally quite complex. This constitutes a problem in the analysis of the structure of organic or inorganic compounds, wherein larger molecules have more complex multi-dimensional NMR spectra. The data acquisition of spectra with acceptable resolution and the interpretation of such spectra is therefore very difficult.

Standard NMR methods are e.g. the HSQC (Heteronuclear Single Quantum Coherence) or HMBC (Heteronuclear Multiple Bond Correlation), see IUPAC recommendations for NMR pulse sequences (Angew. Chem. 2003, 115, 3293-3301). Reynolds and Enriquez describe (J. Nat. Prod. 2002, 65, 221-244) NMR methods for analyzing the structure of natural substances. Frydman (WO 2004/011899) describes a method for acquiring multi-dimensional NMR spectra with one single scan, wherein partitions of a sample are subdivided into a set of independent parts of different resonance frequency ranges, and the sample is measured slice by slice (in dependence on the volume) with selective pulses (thereby simultaneously applying strong gradient pulses). Disadvantageously, this method is insensitive and relatively large sample amounts or high substance concentrations are required. It is also disadvantageous in that it is difficult to carry out, since the signals from the different scans must be added and the requirements for reproducibility of the gradient field strengths are high. K. Takasugi describes a method for spectral reconstruction of convoluted NMR spectra on the basis of multiple convolution, wherein all excited frequencies undergo the same convolution in the indirect dimension during data acquisition, which corresponds to frequency-independent folding (46th ENC Conference, Apr. 10 to 15, 2005, Providence, R.I., USA; Abstract online available on Apr. 6, 2005).

Dunn and Sidebottom (Magn. Reson. Chem. 2005, 43, 124-131) describe a method for calculating back folded NMR spectra with the aim to accelerate data acquisition and the evaluation of the structural confirmation of small organic molecules, wherein 2 or 3 NMR spectra are measured during data acquisition with different reduced spectral windows in the indirect dimension.

Two-dimensional (2D), I,S-correlation experiments consist of a sequence of radio frequency pulses and delays which effect transfer of magnetization between the spins I and S. The chemical shifts of the S-nuclei are acquired in an indirect (digitized) evolution time t1. The delay, during which the evolution of chemical shifts of the S-nuclei takes place, is thereby incremented in steps. This results in modulation of the NMR signal with the frequencies of the S-nuclei during t1. After the magnetization transfer, the chemical shift of the I-nuclei during t2 is directly detected. Fourier transformation along both time axes produces a 2D spectrum with the chemical shifts of the S and I spins as axes. This concept can be easily extended by introducing additional indirect time domains to more than two dimensions (M. Sattler in Angew. Chem. 2004, 116, 800-804). A two-dimensional NMR experiment consists of several phases, the first so-called preparation phase, a second so-called evolution and mixing phase, and the actual detection phase in which an interferogram (FID) is recorded. The time of the evolution phase, which is called t1, is a variable waiting time within a millisecond to second range, within which chemical shift and spin-spin couplings develop. The evolution and mixing phase is followed by time t2, which is also constant. The data recorded in a two-dimensional NMR experiment is often shown in a so-called contour diagram. Such a contour diagram shows a section along a contour line through the cross signals of the spectrum. These two-dimensional experiments can also be performed as part of multi-dimensional experiments.

The standard method for acquiring data of a multi-dimensional NMR spectrum is based on the application of a certain sequence and succession of excitation pulses of high frequency (pulses) and waiting times (delays). The coherence orders of magnetization thereby generated, their transfer to other coherences, and the rules for selecting the desired magnetizations are entirely described by the product operator formalism.

NMR experiments, during which the frequencies were not convoluted in the indirection evolution phases, are synonymously called "normal NMR experiments", "conventional NMR experiments" or "standard-NMR experiments" below. Conventional multi-dimensional NMR spectra are e.g. homonuclear and heteronuclear multi-dimensional NMR experiments, such as HSQC (J. Am. Chem. Soc. 1992, 114, 10663-10665), HMBC, COSY, TOCSY, HSQC-TOCSY, in particular, 2 and 3-dimensional NMR experiments. The dimension of multi-dimensional NMR experiments, e.g. of two-dimensional heteronuclear NMR experiments, is the dimension of the chemical shift of the protons and the dimension of the chemical shift of the observed heteronuclei, e.g. the carbon atoms.

In the conventional method for data acquisition of a multi-dimensional NMR spectrum, the evolution time is usually linearly incremented in the evolution phase, wherein the incrementation time $\Delta t1$ in the evolution phase meets the Nyquist theorem (equation 1) in order to provide the correct spectral window in the indirect dimension.

$$IN0 = 1/(Nd0 \times BF1 \times SW1), \text{ wherein} \qquad \text{Equation 1}$$

d0=initial delay (initial waiting time)
Nd0=number of $\Delta t1$ increments
SW1=spectral window in the indirect dimension
BF1=basic frequency (e.g. at 9.39 T for $^1$H 400.13 Hz and for $^{13}$C 100.58 Hz),
IN0=incrementation time Realization of the above-described experimental conditions thereby observing the Nyquist theorem for correct digitization of the frequencies yields the cross signals in the frequency domain after Fourier transformation (FT) in both dimensions (equation 2), wherein the chemical shift of the measured cross signals are correctly represented in the indirect dimension, i.e. are not folded.

$$S(t1,t2) \to FT \to S(\nu 1, \nu 2), \text{ wherein} \qquad \text{Equation 2}$$

S(t1,t2)=signal after incrementation time
S($\nu$1,$\nu$2)=Fourier-transformed signals Equation 1 shows that the indirect spectral window SW1 is inversely proportional to the incrementation time IN0 (=$\Delta t1$). In consequence thereof, the indirect spectral window SW1 is reduced when $\Delta t1$ is extended, and consequently, the frequencies of those cross signals of a multi-dimensional NMR spectrum, which are outside of the selected spectral window, are no longer correctly digitized and thus do not occur at the original chemical shift in the NMR spectrum. This phenomenon of folding in the data acquisition of NMR spectra is extensively described in the literature (two-dimensional NMR spectroscopy, 2nd ed. 1994, W. R. Croasmun and R. M. K. Carlson, Wiley-VCH, pages 493-503) and generally reduces the overall measuring time and increases the digital resolution of the cross signals, which results from equations 3-5:

$$DR = SW\ [Hz]/TD1^*, \text{ wherein} \quad \text{Equation 3}$$

SW[Hz]=spectral window in Hertz
DR=digital resolution,
TD1*=complex number of experiments $$DR = 1/AQ(t1) \quad \text{Equation 4}$$

AQ(t1)=acquisition time in the indirect dimension according to equation 5.

$$AQ(t1) = Nd0 \times IN0 \times TD1^* \quad \text{Equation 5}$$

For the chemical shifts (called "frequencies" or "apparent frequency" vi in this context) of the cross signals in the indirect dimension of all excited coherences in the evolution time and irrespective of a possible violation of the Nyquist theorem, there is a direct functional dependence on the $\Delta t1$ incrementation time in accordance with equation 6.

$$v_i(\Omega s) = f(\Delta t1)$$

$$v_{i+1}(\Omega s) = f(\Delta t1), \text{ wherein Equation 6}$$

$v_i(\Omega s)$, $v_{i+1}(\Omega s)$=chemical shift of the cross peak i or i+1,
$f(\Delta t1)$=function of the incrementation time $\Delta t1$.

Analysis of the cross signals (cross peaks) of a multi-dimensional NMR spectrum, e.g. a HSQC spectrum, shows, upon closer observation of the resonance frequencies, that the cross signals arrange themselves in preferably overlying signal groups (peak cluster) in frequency space in dependence on their chemical shift. In consequence thereof, there are frequency ranges in the multi-dimensional NMR spectrum, which generally contain no cross signals and therefore no information.

This observation is substantiated by the fact that the aromatic protons with few electrons (low field-shifted signal areas) in first approximation always result in cross signals with carbons in low field shifted areas in an HSQC-NMR spectrum. Since, however, routine measurements are performed over the entire desired chemical shift range in order to satisfy the Nyquist theorem, there are compulsorily void frequency spaces which contain only a few signals or none at all. A conventional HSQC spectrum of an organic molecule of a molecular mass of between 300 and 500 g/mol usually yields an NMR spectrum in which more than 95% of the frequency areas contain no information in the form of cross signals. For small molecules, it is estimated that up to 99% of the frequency space is not utilized.

In NMR spectroscopy, there are moreover different types of radio frequency pulses, so-called RF pulses. The "hard pulses" are rectangular pulses with wide excitation bandwidth (rectangular high power pulses with a wide frequency excitation band). The "hard pulses" are non-selective. "Shape pulses" are pulses which selectively excite defined frequency ranges. Such pulses are e.g. Gauss, rectangular, sine, BURP pulses and are collectively called shaped pulses or selective pulses below (amplitude and power shaped pulses with a selective excitation band), see e.g. Freeman, Journal of Progress in Nuclear Magnetic Resonance Spectroscopy 1998, 32, 59-106.

SUMMARY OF THE INVENTION

The present invention provides a method for folding accumulations of signal groups (also called "clusters") which consist of several cross signals of a multi-dimensional NMR spectrum in a selective fashion and in dependence on their frequency (band selective folding), such that the coordinates of the signals (expressed by their "apparent frequency") are distributed in the folded NMR spectrum of individual clusters or cluster groups in an area of the spectrum which has not been previously occupied by other signals, preferably over the entire existing frequency space. This method permits displacement of cross signals to any position in frequency space, which has a considerable effect on the reduction of the overall measuring time of an NMR experiment, increases the resolution of the NMR spectrum and improves the evaluability of the resulting multi-dimensional NMR spectra. Preferably, all cross signals of a multi-dimensional NMR spectrum are displaced by the inventive method using frequency-dependent folding. Displacement of those cross signals, which strongly overlap with other cross signals, is particularly useful.

The inventive method thus describes a method for data acquisition in multi-dimensional NMR spectroscopy. The method called SHARC protocol (SHaped ARrayed data aCquisition Protocol) utilizes the properties of selective pulses with specific excitation in the desired frequency range of arbitrarily displacing cross signals in the frequency space in combination with folding of the frequencies of the indirect dimension.

BRIEF DESCRIPTION OF THE DRAWING

FIG. 10.1 shows a conventional HSQC-NMR spectrum; and

FIG. 10.2 shows the effect of band-selective folding via the SHARC-HSQC-NMR method.

DESCRIPTION OF THE PREFERRED EMBODIMENT

Figure 1:
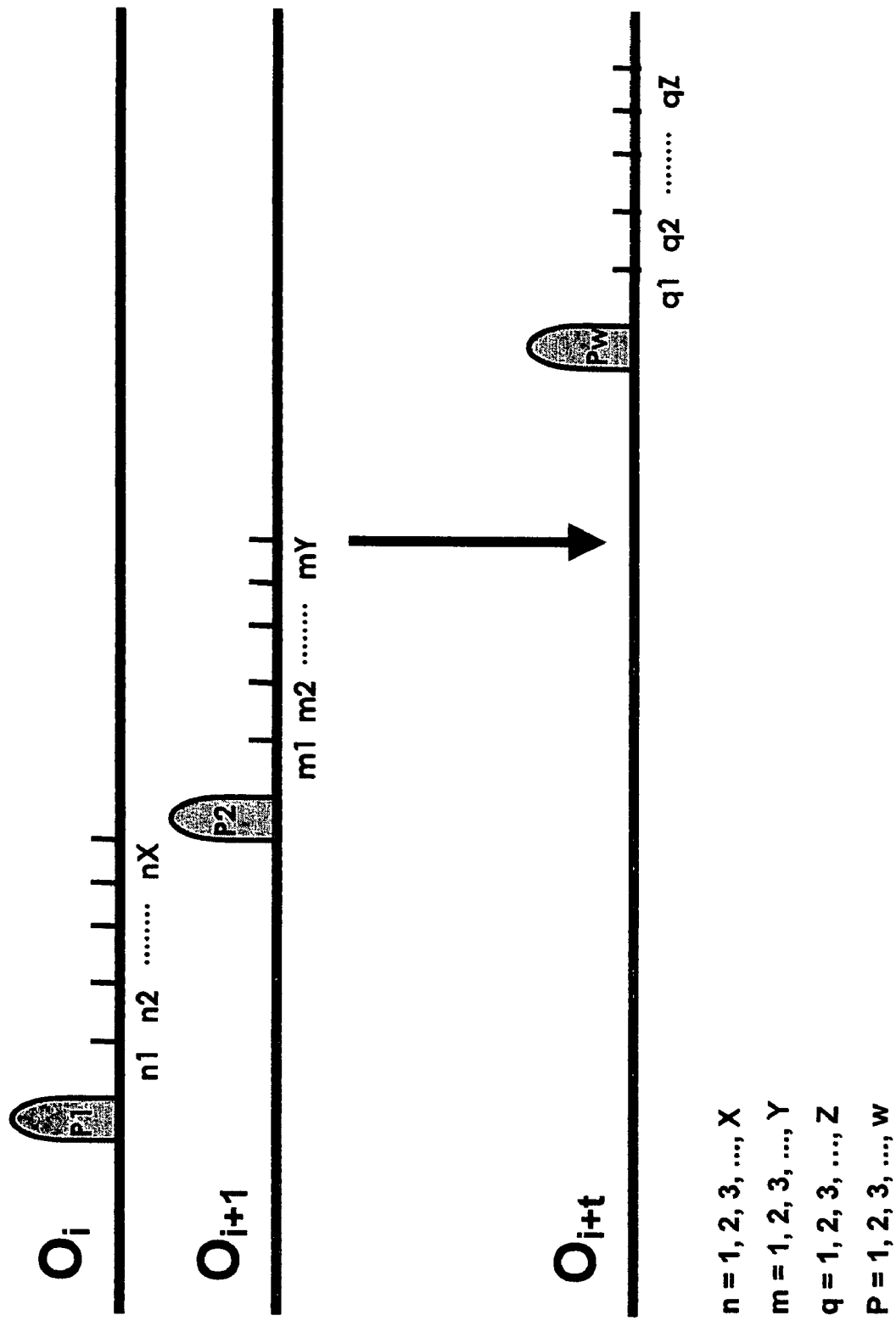
FIG. 1 schematically shows an embodiment of the SHARC sequence with a series of selective pulses.

FIG. 1 schematically shows an embodiment of the SHARC sequence with a series of selective pulses P1, P2, . . . to Pw which are separated by a determined number of incrementable waiting times (delays)={n1, n2, . . . nX}, {m1, m2, . . . , mY}, . . . , {q1, q2, . . . , qZ}. The number {X, Y and Z} of the incrementable waiting times (delays) and the number of selective pulses W to be applied (and thereby the frequency ranges $O_i$, $O_{i+1}$ etc.) may be arbitrarily selected. The range of numbers that can be stated for W depends on the real length of a selective pulse chosen by the user. The real length of a selective pulse, in turn, depends on the desired excitation bandwidth. The shorter the length of a selective pulse, the larger the number of selective pulses that can be introduced into the sequence. The T1/T2 relaxation mechanism is thereby the limiting factor. A preferred range W is 1 to 20.

The T1/T2 relaxation delays (waiting time between individual scans, also called repetition delay) are reduced in the inventive method in contrast to conventional HSQC methods HSQC (Lit.: G. Bodenhausen, D. J. Ruben, Chem. Phys. Lett.) and (L. E. Kay, P. Keifer, T. Saarinen, J. Am. Chem. Soc. (114), 10663-10665, 1992) to ¼ of the conventional T1/T2 relaxation delay (usually 2 seconds) in order to realize a faster interscan delay. This can be explained i.a. in that the total length (in seconds) of the inventive pulse sequences is considerably longer than the standard pulse sequences due to the implemented band-selective pulse (usually in the millisecond range) and the delay to the next scan can therefore be reduced. A high repetition rate (fast scanning mode) is realized as a direct consequence of the reduction of the T1/T2 relaxation delay, which in turn reduces the overall measuring time (fast NMR method).

Figure 2:
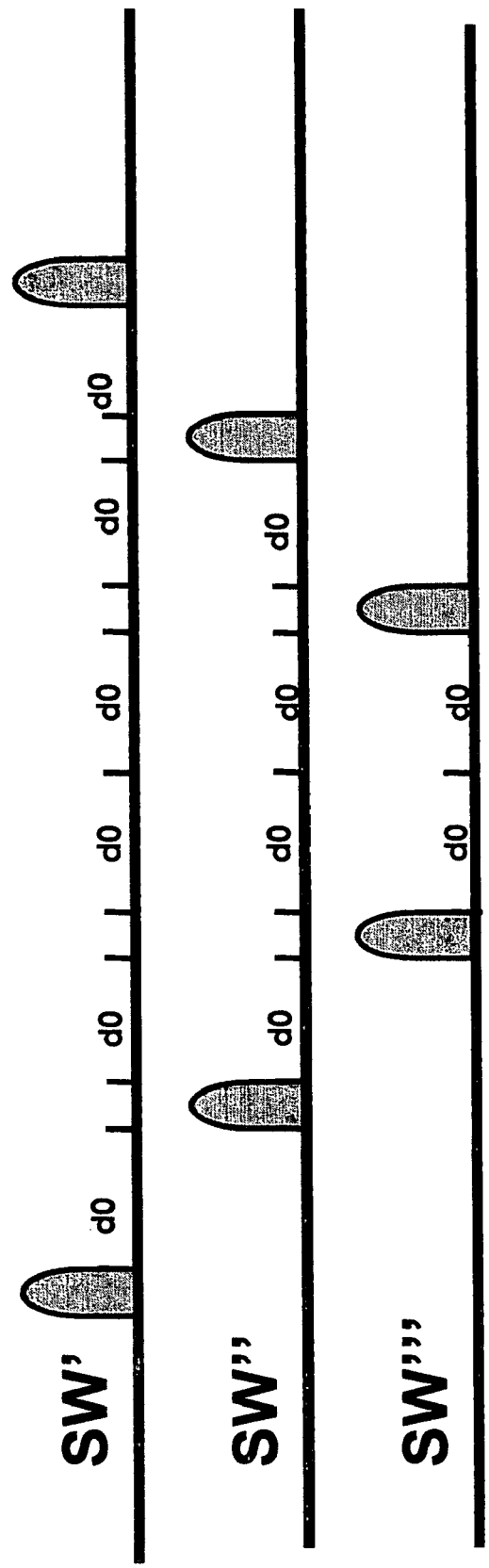
FIG. 2 shows realization of different spectral windows in the indirect dimension.

The incrementation time may be constant (this is shown in FIG. 2 and FIG. 1 for the case $X=Y=\ldots=Z$) or be variable (FIG. 1, wherein the number of increments is variable, $X \neq Y \neq \ldots \neq Z$).

FIG. 2 shows the realization of different spectral windows in the indirect dimension as a function of specific frequencies. After excitation of the frequencies by the respective selective pulses and generation of the transverse magnetization, the chemical shift and spin-spin coupling evolves.

[Shape P1]-[$\Delta t1$]m-[Shape P2]-[$\Delta t1$]n-...-[Shape Pw]-[$\Delta t1$]q Different evolution times of the chemical shift are produced in dependence on the time of application of the selective pulses for the respective frequencies within the spectral window in the indirect dimension SW', SW" etc. With a suitable sequence design, the magnetizations which were transverse at the start of sequence, experience a different chemical shift (or rotation along the Z-axis) than those frequency ranges which experience this selective pulse at a later time in the NMR sequence, wherein the following applies in the example with 3 pulses:

[Shape]1=[$\Delta t0$]m+[$\Delta t0$]n+[$\Delta t0$]p

[Shape]2=[$\Delta t0$]n+[$\Delta t0$]p

[Shape]3=[$\Delta t0$]p

The above-described equations 1 through 6 show the relationship between the incrementation time $\Delta t1 = IN0$ and the spectral window SW1 in the indirect dimension:

SW1$\approx$f(Nd0) and therefore $$SW1 = 1/(Nd0 \times BF1 \times IN0)$$   Equation 7

Thus, the spectral window SW1 can be assumed to be a function of Nd0, the single variable in equation 7, wherein $\Delta t1 = IN0 =$constant and BF1=constant. In contrast thereto, Nd0 is kept constant and IN0 is varied in dependence on the spectral window in conventional non-folded NMR measurements.

This means that, in dependence on the number of incrementation times $\Delta t1$, it is possible to selectively allocate all frequencies excited by a selective pulse to a unique spectral window that can be distinguished from other frequencies in the indirect dimension in the multi-dimensional NMR spectrum within a scanning process.

In contrast to normal folding of a multi-dimensional NMR spectrum, this is a frequency-dependent folding (band selective folding) of the resulting NMR spectrum with the consequence that the coordinates of the cross signals no longer occur at their original chemical shift but are shifted in dependence on their frequency, i.e. are "folded".

The so-called dwell-time of the analog-to-digital converter (ADC) determines the maximum frequency during an NMR experiment, which can be detected within a signal. This condition is the above-mentioned Nyquist frequency and corresponds to half the "sampling rate".

In the t1 dimension of the dwell-time, $\Delta t1$ corresponds to the fixed duration within which t1 is incremented with t2 between the individual experiments. One thereby obtains a discrete matrix F(t1,t2) of the signal F as a function of t1 and t2. t2 is typically shown as rows of F, and t1 as columns. The Fourier transformation of all rows converts these into frequencies, thereby obtaining a matrix F(t1,v2), and after Fourier transformation of all columns, the final two-dimensional spectrum F(v1,v2). The spectral range in the dimension v1 corresponds to the dwell time according to the Nyquist theorem:

$$v1(max) = 1/(2 \ast \Delta t1)$$

The corresponding applies for the spectral region in the dimension v2.

The Nyquist condition is met in conventional NMR spectra. If the signal contains higher frequencies than determined by the condition, cross signals occur in the spectrum at an apparent position which does not correspond to the position in the non-folded spectrum. In this case, one talks of folding ("multi-dimensional NMR in liquids, Basic Principles and Experimental Methods", F. J. M. van de Ven, VCH: Chapter 1, pages 21-23 and chapter 4, two-dimensional NMR, pages 163-165).

The inventive method permits i.a. different folding of two closely adjacent cross signals which can be excited separately by at least one selective pulse, and thereby to change their appearance in a multi-dimensional NMR spectrum. This is of considerable importance for the resolution of the NMR spectrum and corrects the signal distortion and thereby reduces the overall measuring time of the NMR experiment.

The inventive method moreover provides the following variation possibilities of parameterization in order to arbitrarily change the position of the cross signals:

1. The number and type (e.g. Gauss, rectangular, sine, BURP) of the applied selective pulses can be freely selected within a sequence.

2. During excitation via the selected frequency ranges, the order of applied phase-modulated selective pulses can be freely selected in order to obtain optimum distortion correction of the resulting spectra, see FIG. 3.

3. The number of increment times $\Delta t1$ (delays) within the applied selective pulses can be freely selected, wherein the degree of convolution of the cross signals is controlled by the value of $\Delta t1$.

4. The duration of the incrementation times $\Delta t1$ can be freely selected, see FIGS. 1n, m, ... q.

Figure 3:
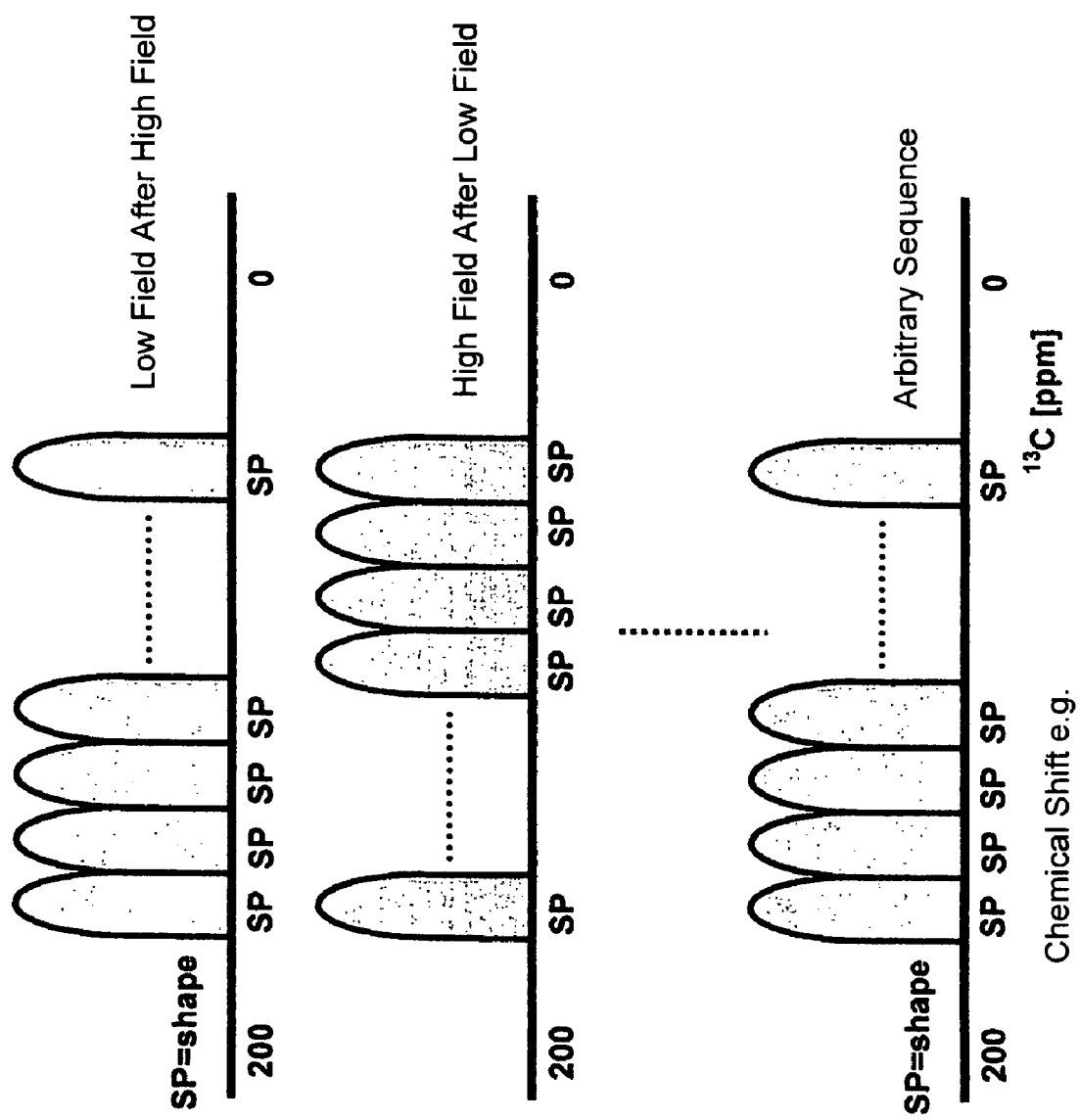
FIG. 3 shows selection of the order of the phase-modulated selective pulses to optimize distortion correction.

In the application of the SHARC protocol, the frequencies or frequency ranges selected by the selective pulses are associated with arbitrarily selected spectral windows in the indirect dimension of a multi-dimensional NMR spectrum (see FIG. 3).

Figure 4:
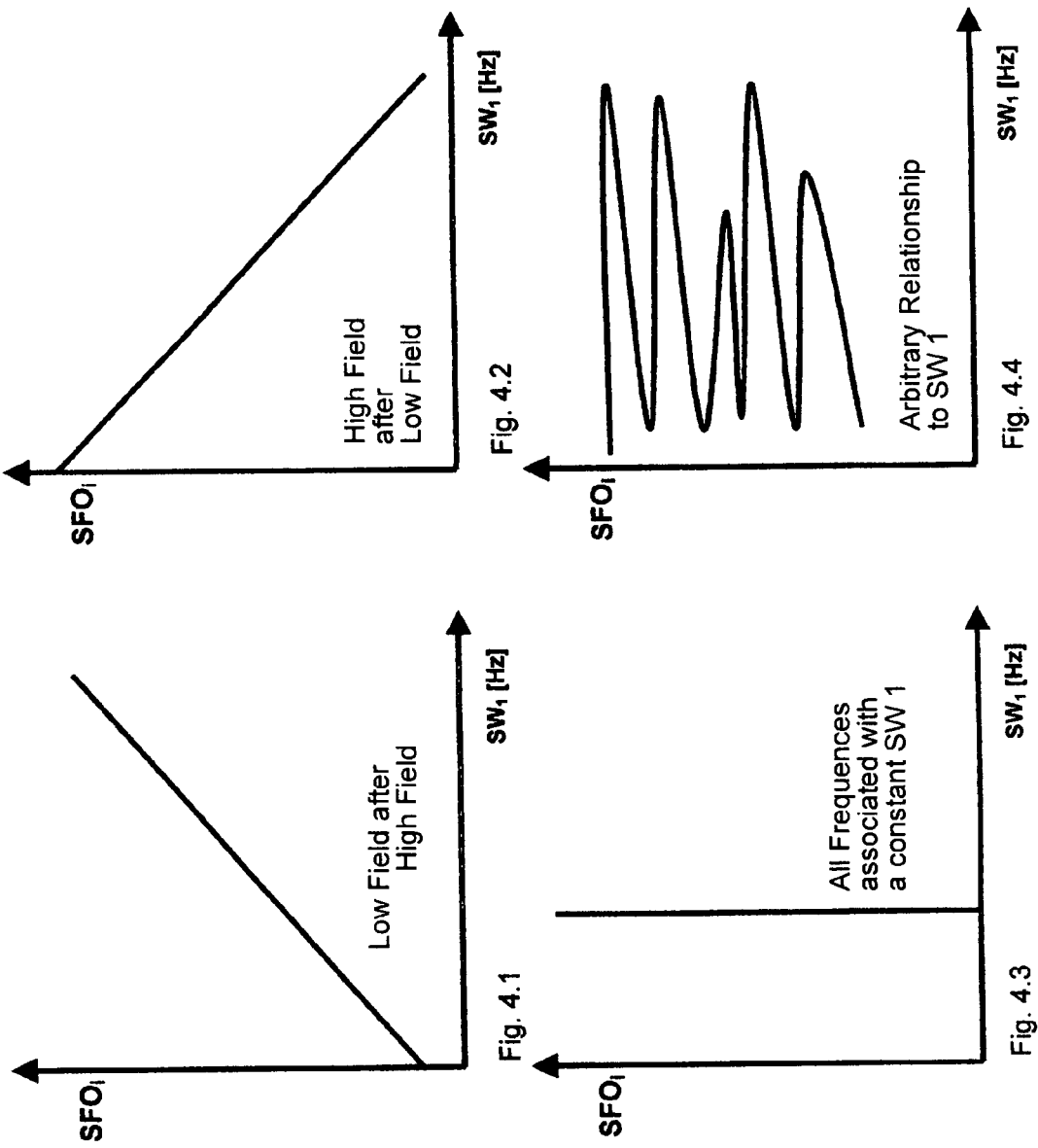
FIG. 4 illustrates the principle of the inventive method.

FIG. 4.3 shows a conventional NMR experiment, wherein all frequencies in the t1 evolution time (e.g. $^{13}C$ shift axis) are associated with the same spectral window in the indirect dimension SW1, e.g. SW1 of 100 ppm (all excited frequencies within an experiment are associated with a constant spectral window (indirect spectral width)).

Figure 6:
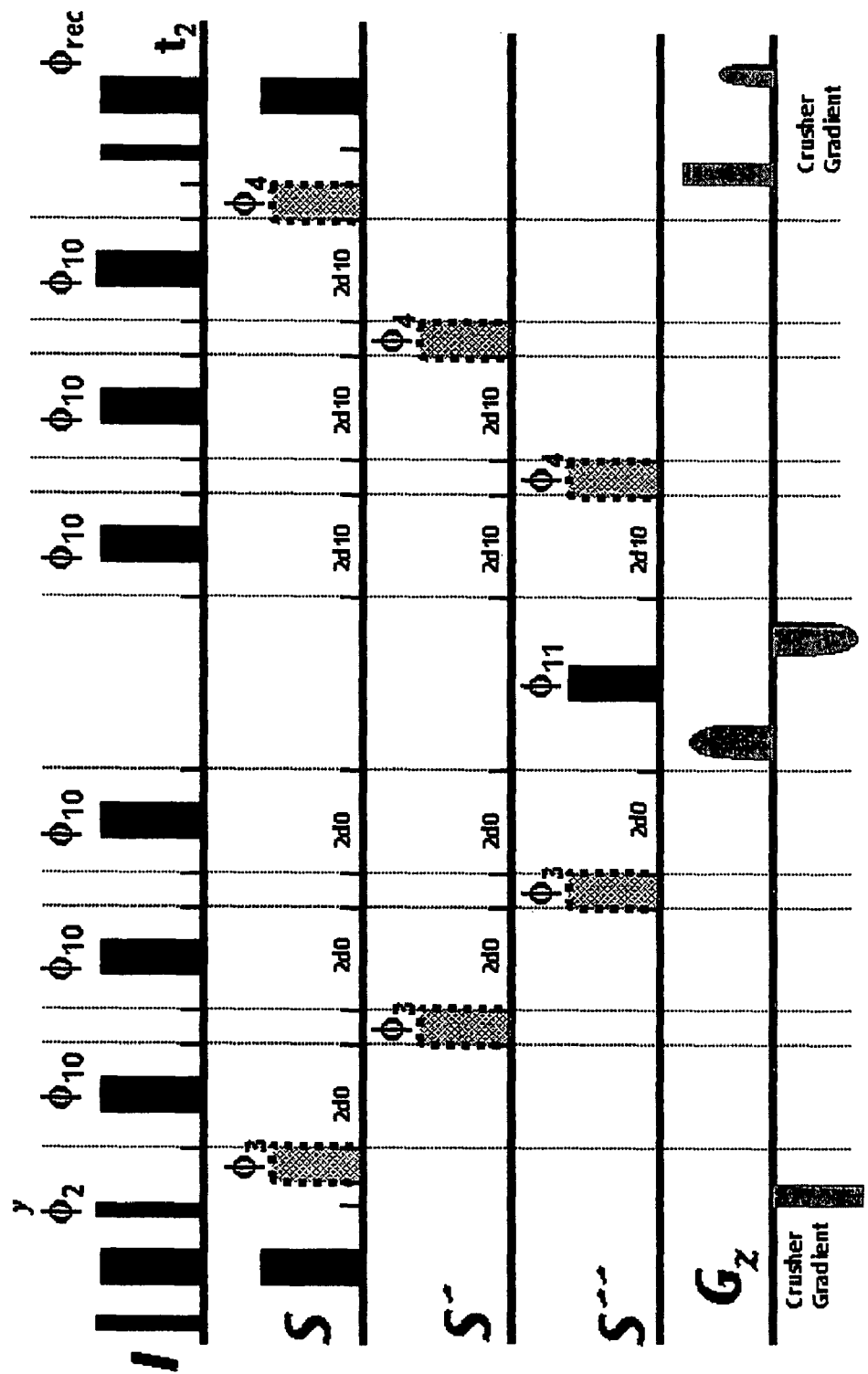
FIG. 6 shows implementation embodiments in an HSQC experiment.

In FIG. 4.4, the frequencies or frequency ranges (frequency bandwidth) selected within one experiment by the selective pulses are associated with variable spectral windows (indirect spectral width) of the indirect dimension and are folded in dependence on the frequency, wherein the general method shown in FIG. 1 or the pulse sequences shown in FIGS. 6 and 6.1 are applied.

The dimension of the NMR experiments, e.g. of the pulse sequences shown in FIGS. 6 and 6.1, is always 2. There are only two dimensions irrespective of the number of incrementable delays $\Delta t1$, i.e. the dimension of the protons and the dimension of e.g. carbon. The allocation of the freely selectable indirect spectral windows to the desired frequencies or frequency ranges is controlled via the order of applied selective pulses and thus the degree of folding.

FIGS. 4.1, 4.2 and 4.4 show the principle of the inventive method: Different spectral windows SW1 are allocated in the indirect dimension to arbitrarily selected transverse magnetizations in the evolution time. The order of allocation of SW1 to the individual selected frequencies (transverse magnetizations in the t1 dimension) may be from low field to high field (FIG. 4.1), from high field to low field (FIG. 4.2), or in any order (FIG. 4.4). One method is preferred, wherein the allocation is selected arbitrarily in order to obtain a maximum signal separation (signal distortion correction).

Equation 6 defines the position of the cross signals as a function of the incrementation time $\Delta t1$ for data acquisition of a non-folded multi-dimensional NMR experiment.

In contrast to equation 6, the following expression must be used to describe the position of the cross signals, thereby taking into consideration the SHARC protocol:

$$v_i(\Omega s) = f(N \times \Delta t1)$$

$$v_i+1(\Omega s) = f(M \times \Delta t1) \quad \text{Equation 8}$$

Due to the complexity of the spectra of numerous organic compounds, the SHARC protocol can contribute to the reduction of the overall measuring time and to a systematic simplification of data acquisition and interpretation, since complex spectra can be transferred into numerous smaller areas and spectra, selected by selective pulses, which can then be evaluated (automatic evaluation systems). The variation of the above-described spectral parameters will enable acquisition of multi-dimensional spectra of the defined regions of a complex spectrum, wherein at the same time the position of the signals of the partial spectra can be iteratively optimized, such that preferentially the entire available frequency space is utilized, so that no high digital resolution is required.

Figure 5:
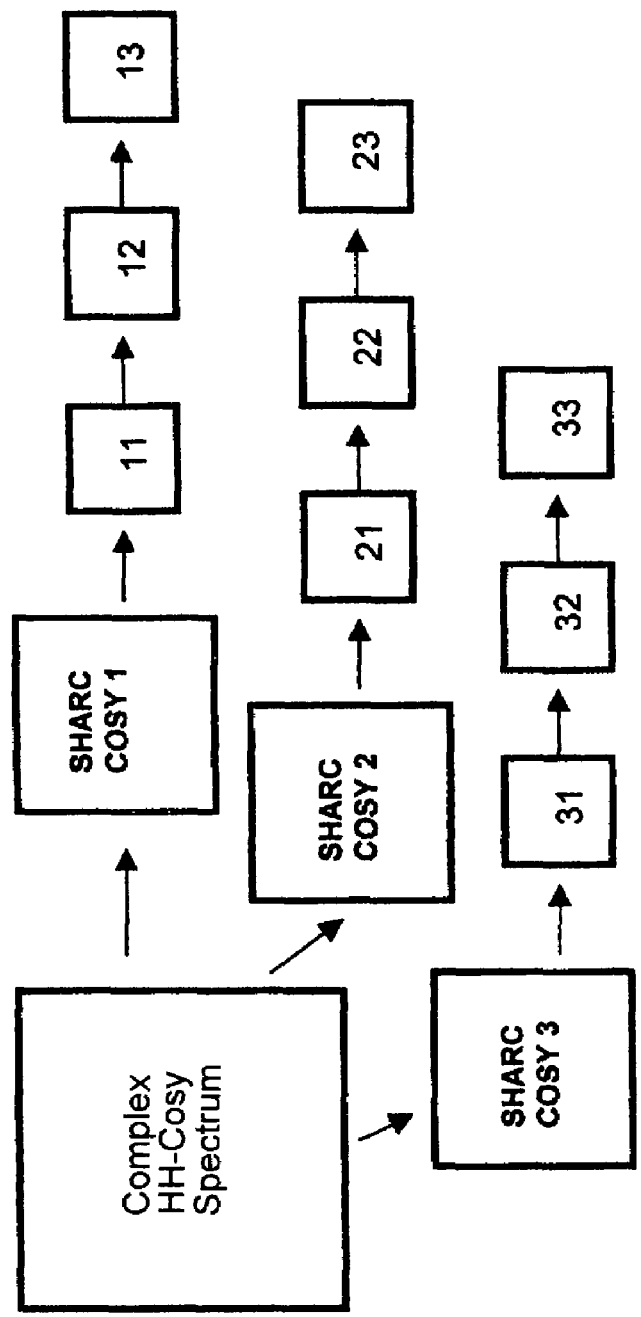
FIG. 5 illustrates systematized data acquisition.

FIG. 5 shows such systematized data acquisition. The SHARC protocol can e.g. be used in the field of automatic structure determination, since the entire complex multi-dimensional spectrum can be simplified into partial spectra.

The SHARC protocol can be implemented in any homonuclear and heteronuclear multi-dimensional NMR experiments (n larger or equal to 2) such as HSQC, HMBC, COSY, TOCSY, HSQC-TOCSY etc. Homonuclear and heteronuclear n-dimensional NMR experiments are known in literature (listed e.g. in Angew. Chem. 2003, 115, 3293-3301). 2- and 3-dimensional NMR experiments are preferred. Cross signals of one of the following nuclei with identical or different nuclei are preferred: $^1H$, $^{13}C$, $^{15}N$, $^{31}P$.

FIGS. 6 and 6.1 show implementation versions of the above presented SHARC concept in an HSQC experiment. The experiment is therefore called SHARC-HSQC. FIG. 6 shows a SHARC-HSQC sequence, wherein only 3 frequency ranges S, S' and S'' are represented by the selective pulses for reasons of simplification. FIG. 6.1 shows the same sequence, wherein the selective pulses are shown on top of each other.

The band-selective regions of an indirect dimension are shown in FIG. 6 with S, S', S'', wherein preferably the sine-shaped pulse field gradient is 1 ms or 0.5 ms. The following phase cycling was used: $\phi2=1\ 1\ 1\ 1\ 3\ 3\ 3\ 3$, $\phi3=0\ 2$, $\phi4=0\ 0\ 2\ 2$, $\phi10=0$, $\phi11=0$, $\phi rec=0\ 0\ 2\ 2\ 0\ 2\ 0\ 0\ 2$. The data of the SHARC-HSQC experiment was collected in the Echo/anti-Echo mode. The phases $\phi3$ and $\phi rec$ were inverted through 180 degrees after each t1 increment in order to displace the central signals at the edges of the HSQC spectrum. The frequency range S corresponds e.g. to a chemical shift range of 180 to 100 ppm of the nucleus 13C, the frequency range S' corresponds to a chemical shift range of 60 to 40 ppm of the nucleus 13C, and the frequency range S'' corresponds to a chemical shift range of 20 to 10 ppm of the nucleus 13C.

The INEPT part of the pulse sequence in FIG. 6 generates 2IzSz magnetizations (so-called ZZ magnetizations) which are transferred in a band-selective fashion through the selective 90 degree pulses (grey-dashed rectangles) into the 2IzSy magnetizations in dependence on their frequency, where the 13C nuclei are chemically shifted (chemical shift labeling in t1 dimension).

The width of the spectral window (spectral width) of the indirect time dimensions is defined by the number of $\Delta t1$ increments (FIG. 6: 2d0). In accordance with the sequence shown in FIG. 6, only the waiting times "delay" d0 are incremented. For refocusing the phase errors, obtained by application of the selective pulses, the non-incrementable compensation delays d10 were introduced in accordance with FIG. 6, wherein d10 must be equal to d0 at the start of the experiment.

FIG. 6 also shows that the magnetizations (2IzSz), which are transferred into the transverse magnetization (2IzSy) by the first band-selective 90 degree pulse, must be allocated to another $\Delta t1$ time than those 2IzSz magnetizations which reach the transverse position (2IzSy) by the second and third band-selective pulse.

In the inventive method, magnetizations along the Z axis (e.g. 2IzSz, Iz) are stored by the SHARC pulse sequences in order to allocate these in selective consecutive order to different indirect spectral windows with certain previously defined frequency ranges. The frequency range S is (2IzSy) 3×2d0 ($\Delta t1$ times). Thus, the frequency range S is associated with the indirect spectral window SW. The frequency range S corresponds e.g. to a chemical shift of 20-10 ppm. The frequency range S' (2IzS'y) is moreover 2×2d0 ($\Delta t1$ times). Thus, the frequency range S' is associated with the indirect spectral window SW' (the frequency range S' corresponds e.g. to a chemical shift of 90 to 35 ppm). The frequency range S'' (2IzS''Y) is moreover 1×2d0 ($\Delta t1$ times). Thus, the frequency range S'' is allocated to the indirect spectral window SW'' (the frequency range S corresponds e.g. to a chemical shift of 200-100 ppm). The connection between the number of incrementable $\Delta t1$ times and the indirect spectral window is defined by the following equation:

$$\Delta t1 = [1/(Nd0 \times SW \times BF1)]$$

wherein Nd0 is the number of increments d0.

The data acquisitions with 3 band-selective pulses, shown in FIGS. 6 and 6.1, and 7 and 7.1, respectively, are only examples for the number of band-selective pulses. The number n of band-selective pulses can be freely selected, n is e.g. 1 to 20, preferably 1 to 10, with particular preference 1 to 6.

FIG. 6.1 describes a gradient-supported phase-sensitive version of the inventive SHARC method applied to an HSQC- NMR experiment. The illustrated SHARC-HSQC sequence can be understood as a sum of N different selective HSQC's with different spectral windows in t1 each. The illustrations show only three selective pulses (and thus three different phase-modulated selective pulses with the phases φ3, φ4 etc.) for reasons of clarity. There is, however, no limitation in view of the number of selective pulses to be used. Only the Δt0 delays are incremented by the corresponding Δt1 times. The d0's were incremented in FIGS. 6 and 6.1, the d10's remained constant.

Figure 7:
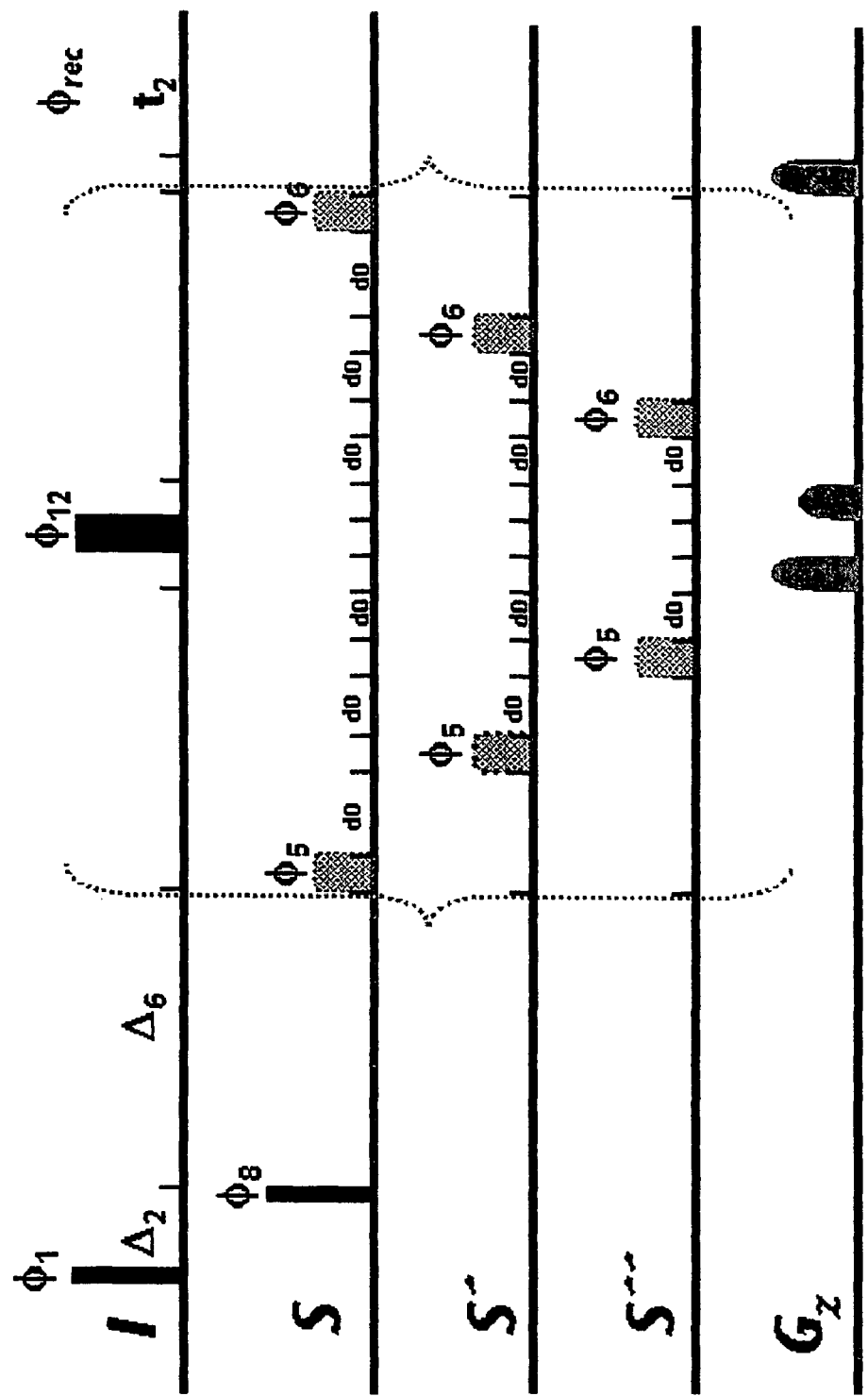
FIGS. 7 and 7.1 show implementation embodiments in an HMBC experiment.

FIGS. 7 and 7.1 show a version of implementation of the SHARC concept in the HMBC experiment. The experiment can therefore be called SHARC-HMBC. It is a gradient-supported phase-insensitive (magnitude mode) version of SHARC-HMBC: the illustrated SHARC-HMBC sequences can be understood as a sum of N different selective HMBCs with different spectral windows each in col. Three selective pulses (and thereby three different phase-modulated selective pulses with the phase φ3) are shown for reasons of clarity. There is, however, no limitation with regard to the number of selective pulses to be used. The phase cycles are given as follows: φ5=0 2; φ6=0 0 2 2, φ12=0 0 0 0 2 2 2 2; φrec=0 2 2 0; frequency discrimination in ω1 is realized by phase modulation (phase twisted line shape); $\Delta_2 = \frac{1}{2} {}^{*1}J_{HC}$, $\Delta_6 = \frac{1}{2} {}^{*n}J_{HC}$ =defocusing delay.

The pulses shown in FIGS. 6 through 7.1 have the following meaning:

- Filled-in rectangle narrow (I)=corresponds to a 90 degree hard pulse;
- Filled-in rectangle wide (I)=corresponds to a 180 degree hard pulse;
- Light grey rectangle with dashed edges (S, S'; S")=correspond to selective 90 degree pulses;
- Dark grey rectangle ($G_Z$)=crusher gradient (Z-axis) for eliminating undesired transverse magnetizations;
- Dark grey half-cones ($G_Z$)=gradients for selecting the desired magnetizations of so-called selection gradients.

The inventive method for data acquisition of multi-dimensional NMR spectra provides different indirect spectral windows SW1, preferably within one scan, in dependence on the selected frequencies.

The inventive method realizes different pre-defined convolutions in selected frequency ranges in the resulting NMR spectrum within one scan, wherein the desired frequency range is selected by frequency-dependent pulses (band-selective pulse=shape pulse). FIG. 10.1 shows a conventional HSQC-NMR spectrum, wherein the cross signals are shown on top of each other. FIG. 10.2 clearly shows the result of performance of the concept of band-selective folding based on the application of a variant of the SHARC-HSQC-NMR experiment. Compared to the standard HSQC-NMR experiment, in this case, four desired frequency regions of varying spectral windows in the indirect dimension are allocated (here e.g. 100 ppm, 5 ppm, 35 ppm, 1 ppm) to one scanning process and in accordance with the pulse sequences shown in FIGS. 6 and 6.1, whereby the SHARC-HSQC-NMR spectrum is divided into four indirect spectral windows (indirect spectral width) S, S', S" and S"' after simultaneous detection of the four sub spectra. The superposed indirect spectral windows S, S', S" and S"' represent the result of data acquisition of the SHARC-HSQC-NMR spectrum. It is clear that each of these four spectral windows S, S', S" and S"' can have different foldings in the indirect dimension.

The present patent application therefore concerns a method for data acquisition of multi-dimensional NMR spectra with band-selective folding, characterized in that (1.) n frequency ranges of chemical shifts are selected for each arbitrary nuclear species whose correlation spectrum shall be detected, (2.) the n frequency ranges selected in step (1.) of the chemical shifts are successively excited by suitable selective pulses, wherein n folded multi-dimensional NMR spectra are obtained per indirect dimension in a band-selective fashion and within one scanning process, which differ from each other with respect to the degree of folding in the indirect spectral windows SW1.

Preferably at least one frequency range that contains overlapping cross signals is selected in step (1.).

For selecting the frequency range, either a multi-dimensional NMR spectrum is acquired, preferably a multi-dimensional NMR spectrum with low digital resolution, or the frequency ranges are determined without acquiring an NMR spectrum.

The multi-dimensional NMR spectrum is preferably a homonuclear NMR spectrum, a heteronuclear NMR spectrum, or an imaging method (imaging experiment). Moreover, the multi-dimensional NMR spectrum is preferably a 2-dimensional or a 3-dimensional NMR spectrum. The nuclear species is preferentially 1H, 13C or 15N. Examples for multi-dimensional NMR spectra are HSQC, HMBC, HMQC, COSY, DOSY, NOESY, ROESY, TOCSY or HSQC-TOCSY spectra.

In a preferred embodiment, the T1/T2 relaxation time, the so-called repetition delay, is reduced by a factor of 4 to 6, preferably 5. The T1/T2 relaxation time is e.g. reduced to a duration of approximately 400 milliseconds compared to 2 seconds, which corresponds to the standard value of the relaxation time in a conventional spectrum. The entire measuring time is thereby accelerated, thus reducing the total experimental measuring time.

The pulse sequence and the incrementable waiting times of the selective pulses also preferably correspond to the sequence shown in FIG. 1. The pulses of the pulse sequence shown in FIG. 6, FIG. 6.1, FIG. 7 or FIG. 7.1 preferably correspond to the illustrated pulse sequence.

When the inventive method is used to acquire an NMR spectrum of more than two dimensions, steps (1.) and (2.) are performed simultaneously for more than only one nuclear species, wherein e.g. 13C or 15N band-selective foldings are obtained in several indirectly measured spectral windows of the respective nuclear species.

Calculation of the SHARC-HSQC data obtained in step (3.) back to the chemical shifts or spectral windows of the associated standard HSQC spectrum is possible in accordance with Dunn and Sidebottom (Magn. Reson. Chem. 2005, 43, 124-131) or Takasugi (46th ENC Conference, Apr. 10 to 15, 2005, Providence, R.I., USA). The chemical shifts of the corresponding non-folded multi-dimensional NMR spectrum correspond to the real values which are obtained during acquisition of a non-folded NMR spectrum. These signals are often present in the form of a cluster, i.e. with poor resolution, as described above.

In a particularly preferred embodiment, the SHARC protocol is implemented in a two-dimensional HSQC-NMR experiment, i.e. a spectrum which has two frequency axes. The intensities of the cross signals thereby produced correspond to the third dimension.

The inventive method facilitates the evaluability of multi-dimensional NMR spectra and provides very fast data acquisition of NMR measurements, in particular, with simultaneously improved resolution.

The method can be applied in the structural analysis of organic compounds, e.g. natural substances and/or peptides.

The inventive method can also be used to analyze the structure of inorganic compounds, for automatic structure determination, in biological NMR spectroscopy, for screening of organic compounds, for the analysis of complex mineral oil fractions and in metabonomics (complex mixtures).

Figure 9:
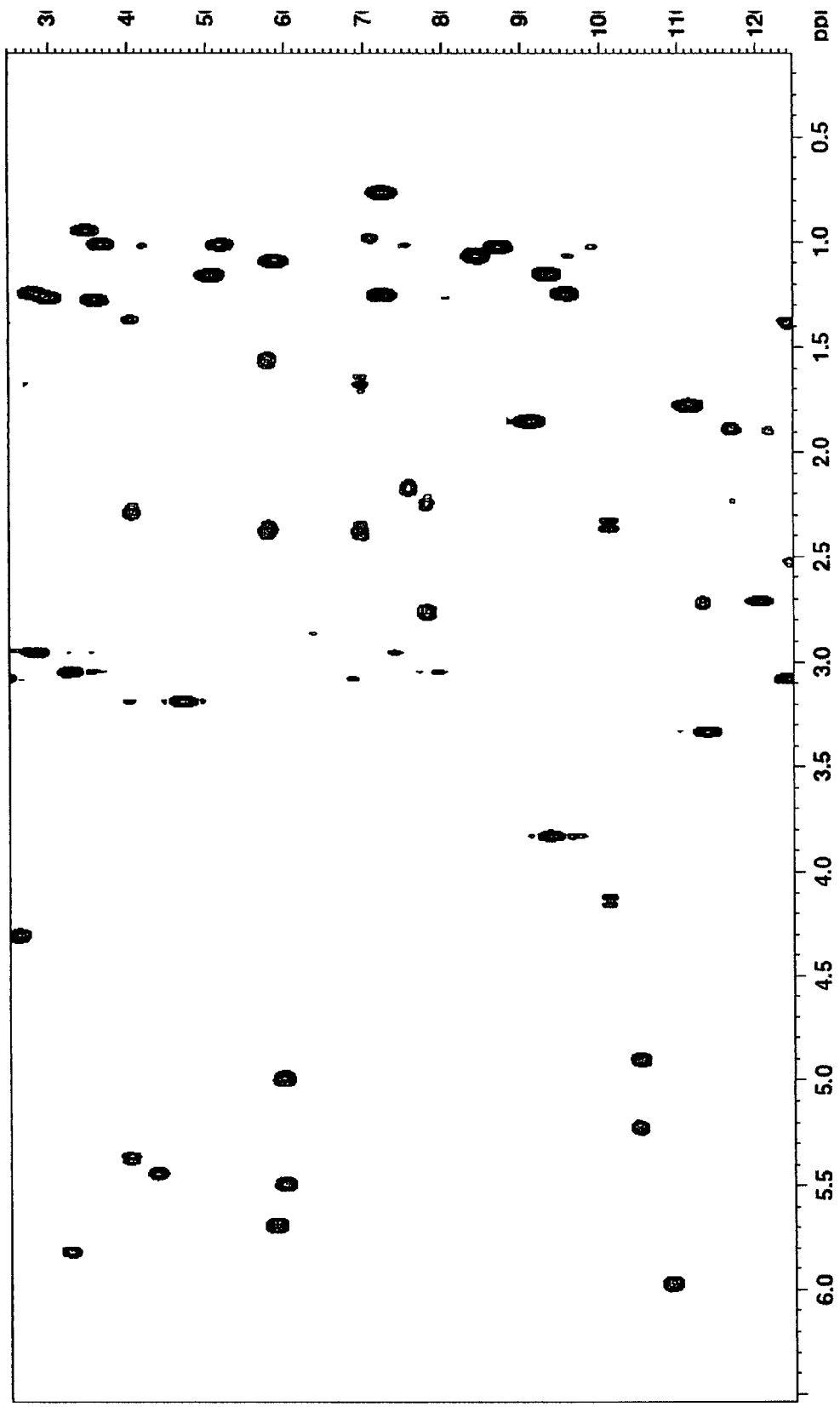
FIG. 9 shows a SCHARC-HSQC thereof.

One example of data acquisition in accordance with the described SHARC protocol is a two-dimensional SHARC-HSQC for structure analysis of the natural substance Cyclosporine A in accordance with FIG. 9:

The SHARC-HSQC measurements of the cyclic peptide Cyclosporine A (50 mM) [Bruker Standard Sample] dissolved in deuterized benzene $C_6D_6$ (lock) were performed with a Bruker AVANCE 400 spectrometer with a spectrometer frequency of 400.13 MHz (9.39 tesla) and at a temperature of 300 K. Phase-sensitive 2D-SHARC-HSQC measurements were performed with the sequence of FIGS. 6 and 6.1, respectively.

Prior to performance of the actual experiment, a π/2 (90 degrees) proton pulse calibration is optionally performed in order to ensure maximum transfer of magnetization at a later time. Moreover, the power of the π/2 selective pulses should be calibrated in connection with the pulse length and the so-called excitation bandwidth either directly on the sample or be calculated by approximation with the spectrometer software. Both solutions for calibrating the power of the π/2 selective pulses can be used in the present method.

In order to evaluate the frequency ranges for the selective excitation in the actual SHARC-HSQC experiment, a standard 2D-HSQC with low digital resolution was acquired in advance. This is not absolutely necessary for performing the experiment. It is clear that information from other NMR spectra, e.g. 1D-$^{13}$C-NMR, multiplicity-edited $^{13}$C(DEPT) can also be used as an auxiliary means. It is also possible to basically determine frequency ranges without determining the signal coordinates by a control experiment. In this case, however, the desired bandwidths must be fully covered by selective pulses.

It is then possible to determine frequencies or frequency bands with corresponding cross signals and allocate them to the excitation ranges of the selective pulses. It can thereby additionally be estimated how many selective pulses must be used to perform the SHARC-HSQC experiment. It must be noted that during transfer to higher magnetic fields, a larger number of selective pulses can be used within the frequency ranges, thus obtaining a higher degree of cross signal dispersion over the present frequency space. This is clarified by the following simple calculation: With a magnetic field strength of 9.39 Tesla, the spectral window of 20 ppm in the proton NMR spectrum has a bandwidth of approximately 8 KHz, while the bandwidth of the proton NMR spectrum of a 900 MHz spectrometer with the same spectral window is approximately 18 KHz. The use of a selective pulse with an excitation bandwidth of 400 Hz, would obviously result in an implementation of approximately double the amount of selective pulses with higher field.

In order to perform the above-mentioned SHARC-HSQC sequence and to obtain selective excitation of the frequency ranges in the indirect dimension, phase-modulated selective pulses are i.a. used (in dependence on the instantaneous transmitter offset). For this reason it is possible to excite the respective frequency regions through phase-modulated selective pulses with constant transmitter offset in order to obtain the phase coherence of the frequency. The sequences of FIGS. 6 and 6.1, respectively, were used as pulse sequence.

The SHARC-HSQC of Cyclosporine A was acquired with 256 complex data points in t1 and with 2K data points in t2. 8 transients were acquired per data point. The spectral width in t2 was 8250 Hz. During signal detection in t2, a GARP sequence with a field strength of 3333 Hz was used for heteronuclear decoupling. A 2KX512 data matrix was obtained after zero filling, linear prediction and Fourier transformation. The relaxation time was 2 seconds. A gradient echo/antiecho method was used to distinguish the signs of the frequencies in the indirect dimension and the accompanying phase sensitivity of the 2D-SHARC-HSQC spectrum, wherein after each t1 increment, the phase of the selective π/2 pulses and the phase of the receiver were inverted by π.

As was indicated above in the description of 2D-NMR spectroscopy, the variable Δt0 (in the drawing d0) is then incremented by Δt1 after each t1 increment. The frequencies in the indirect dimension (in the present case carbon) thereby experience different rotations about the chemical shift vector depending on the time at which they meet the individual selective pulses.

Based on the pulse sequence, as shown in FIGS. 6 and 6.1, suitable π pulses were used in the proton channel for heteronuclear decoupling in the t1 evolution times. The n pulses are used symmetrically within Δt0 and n×Δt0, respectively, and after each selective pulse in the carbon channel.

During the t1 evolution time, so-called phase errors accumulate, due to application of the respective selective pulses which may have a duration of several milliseconds, which must be compensated for. For this reason, a so-called π hard pulse in the carbon channel at the middle of the t1 evolution times, refocuses all previous chemical shifts, such that, at the start of incrementation with Δt1, there are no phase errors left and later phase correction in the indirect dimension is not required after acquisition of all data points and NMR data processing.

Figure 8:
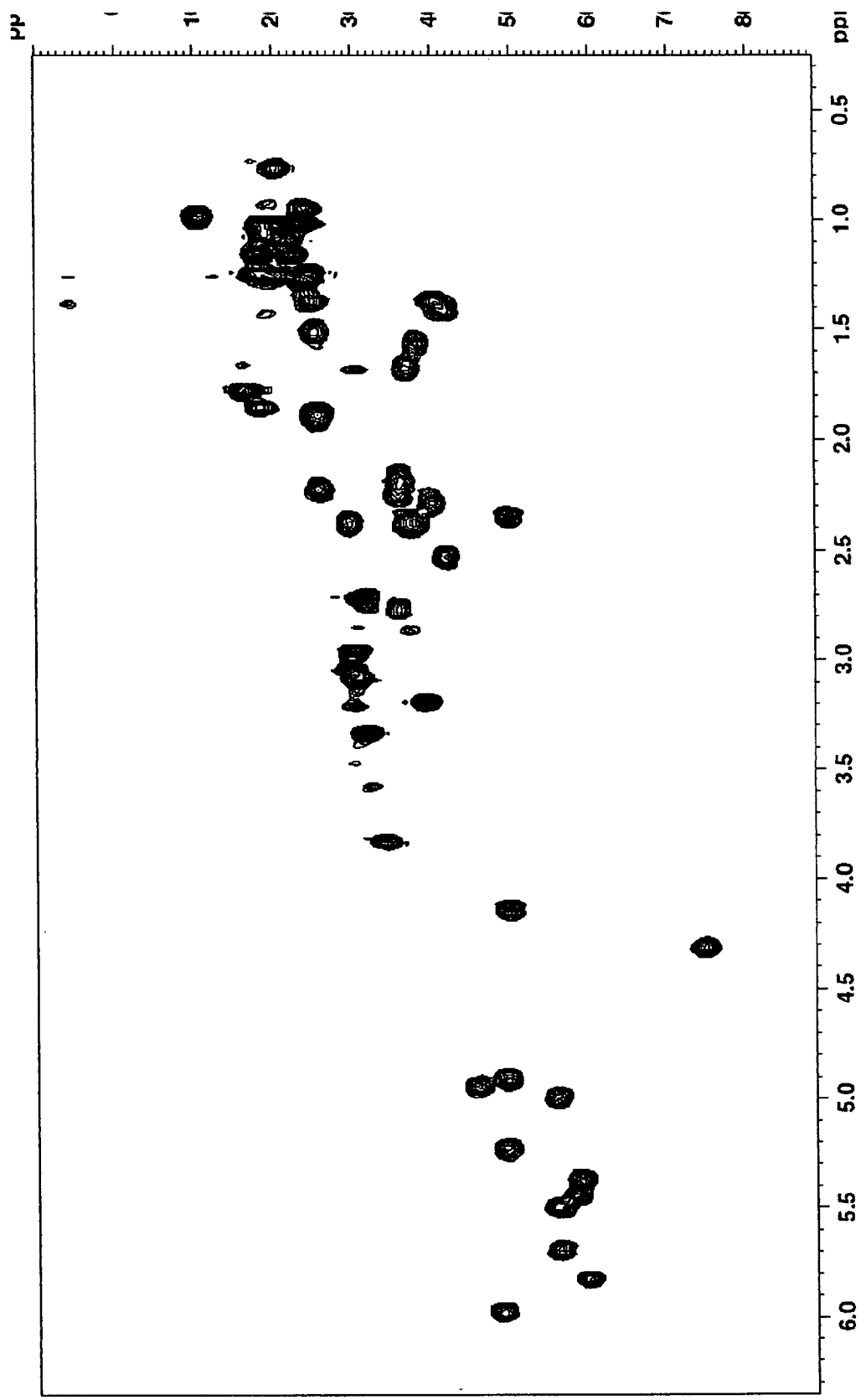
FIG. 8 shows a standard HSQC of Cyclosporine A.

FIG. 8 shows a standard-HSQC of Cyclosporine A (Bruker standard sample).

FIG. 9 shows a SHARC-HSQC which was acquired with the above-mentioned conditions. It clearly shows the cross peaks which were shifted to previously unused areas.

The following parameters were observed in the measurement of the SHARC-HSQC-NMR of Cyclosporine A (Bruker AVANCE 400 Spectrometer list):

| PROBHD | 5 mm BBO BB-1H | NUC1 | 1H | GPNAM16 | SINE.100 |
|---|---|---|---|---|---|
| PULPROG | sapefreqEXC_10 | P1 | 8.80 usec | GPNAM17 | SINE.100 |
| TD | 2048 | P2 | 17.60 usec | GPNAM18 | SINE.100 |
| SOLVENT | DMSO | P29 | 2000000.00 usec | GPNAM19 | SINE.100 |
| NS | 8 | PL1 | −1.50 dB | GPNAM20 | SINE.50 |
| DS | 8 | PL29 | 120.00 dB | GPX16 | 0.00% |
| SWH | 8250.825 Hz | SFO1 | 400.1316005 MHz | GPX17 | 0.00% |
| FIDRES | 4.028723 Hz | CPDPRG2 | garp | GPX18 | 0.00% |
| AQ | 0.1242194 sec | NUC2 | 13C | GPX19 | 0.00% |

-continued

| | | | | | |
|---|---|---|---|---|---|
| RG | 12288 | P4 | 19.00 usec | GPX20 | 0.00% |
| DW | 60.600 usec | P11 | 2000.00 usec | GPY16 | 0.00% |
| DE | 6.00 usec | PCPD2 | 75.00 usec | GPY17 | 0.00% |
| TE | 300.0 K | PL0 | 120.00 dB | GPY18 | 0.00% |
| d0 | 0.00000300 sec | PL2 | 2.00 dB | GPY19 | 0.00% |
| d6 | 0.00000070 sec | PL12 | 19.95 dB | GPY20 | 0.00% |
| d10 | 0.00000300 sec | SFO2 | 100.6202720 MHz | GPZ16 | 45.00% |
| d11 | 0.05000000 sec | SP10 | 40.75dB | GPZ17 | 33.0% |
| IN0 | 0.00005521 sec | SP11 | 40.75 dB | GPZ18 | 40.00% |
| I3 | 128 | SP12 | 40.75 dB | GPZ19 | 38.00% |
| P3 | 9.50 usec | SP13 | 40.75 dB | GPZ20 | 40.60% |
| SPNAM10 | test.2 | SPOFF10 | −5643.00 Hz | SI | 992 |
| SPNAM11 | test.2 | SPOFF11 | −3905.00 Hz | SF | 400.1300000 MHz |
| SPNAM12 | test.2 | SPOFF12 | −2144.00 Hz | WDW | QSINE |
| SPNAM13 | test.2 | SPOFF13 | 0.00 Hz | SSB | 2 |
| ND0 | 2 | | | LB | 0.00 Hz |
| TD | 256 | | | GB | 0 |
| SFO1 | 100.6203 MHz | | | PC | 1.00 |
| FIDRES | 35.374687 Hz | | | SI | 512 |
| SW | 90.001 ppm | | | MC2 | echo-antiecho |
| FnMODE | Undefined | | | SF | 100.6127690 MHz |
| | | | | WDW | QSINE |
| | | | | SSB | 2 |
| | | | | LB | 0.00 Hz |
| | | | | GB | 0 |

I claim:

1. A method for data acquisition of multi-dimensional NMR spectra with band-selective folding, the method comprising the steps of:
  a) selecting n frequency ranges of chemical shifts for each arbitrary nuclear species whose correlation spectrum is to be detected; and
  b) successively exciting the n frequency ranges, selected in step a), of the chemical shifts by suitable selective pulses, wherein n folded multi-dimensional NMR spectra are obtained per indirect dimension in a band-selective fashion and within one scanning process, which differ with respect to the respective degree of folding in the indirect spectral window.

2. The method of claim 1, wherein, in step a), at least one frequency range is selected that contains overlapping, cross signals.

3. The method of claim 1, wherein, in step a), a multi-dimensional NMR spectrum is acquired for selecting the frequency range.

4. The method of claim 3, wherein the multi-dimensional NMR spectrum has low digital resolution.

5. A method for data acquisition of multi-dimensional NMR spectra with band-selective folding, the method comprising the steps of:
  a) selecting n frequency ranges of chemical shifts for each arbitrary nuclear species whose correlation spectrum is to be detected; and
  b) successively exciting the n frequency ranges, selected in step a), of the chemical shifts by suitable selective pulses, wherein n folded multi-dimensional NMR spectra are obtained per indirect dimension in a band-selective fashion and within one scanning process, which differ with respect to the respective degree of folding in the indirect spectral window, wherein, in step a), a multi-dimensional NMR spectrum is acquired with low digital resolution to determine the selected frequency range or frequency ranges are determined without acquiring an NMR spectrum with low digital resolution.

6. The method of claim 1, wherein the multi-dimensional NMR spectrum is a homonuclear NMR spectrum, a heteronuclear NMR spectrum, or an imaging method.

7. The method of claim 1, wherein the multi-dimensional NMR spectrum is a 2-dimensional or a 3-dimensional NMR spectrum.

8. The method of claim 1, wherein the nuclear species is 1H, 13C or 15N.

9. The method of claim 1, wherein the multi-dimensional NMR spectrum is a HSQC, HMBC, HMQC, COSY, DOSY, NOESY, ROESY, TOCSY or HSQC-TOCSY spectrum.

10. The method of claim 1, wherein a T1/T2 relaxation time is reduced.

11. The method of claim 1, wherein, in step b), the pulse sequence and the incremented waiting times of the selective pulses correspond to the sequence shown in FIG. 1.

12. The method of claim 1, wherein, in step b), the pulses correspond to the pulse sequence shown in FIG. 6 or FIG.

13. The method of claim 1, wherein, in step b), the pulses correspond to the pulse sequence shown in FIG. 7 or FIG. 7.1.

14. The method of claim 1, wherein steps a) and b) are performed simultaneously for more than only one nuclear species, wherein band-selective foldings are obtained in several indirectly measured spectral windows of respective nuclear species.

15. The method of claim 1, further comprising calculating the chemical shifts of the corresponding non-folded multi-dimensional NMR spectrum from coordinates of cross signals of n folded indirect spectral windows.

16. Use of the method of claim 1, for facilitating evaluation of multi-dimensional NMR spectra.

17. Use of the method of claim 1, for analyzing structure of inorganic and organic compounds, for analyzing structure of natural substances and/or peptides, for automatic structure determination, for biological NMR spectroscopy, for screening of organic compounds, for analysis of complex mineral oil fractions, or in metabonomics.

* * * * *